US012684767B2

(12) United States Patent
Richter et al.

(10) Patent No.: US 12,684,767 B2
(45) Date of Patent: Jul. 14, 2026

(54) STRUCTURE WITH BURIED DOPED REGION FOR COUPLING SOURCE LINE CONTACT TO GATE STRUCTURE OF MEMORY CELL

(71) Applicant: GlobalFoundries U.S. Inc., Malta, NY (US)

(72) Inventors: Ralf Richter, Dresden (DE); Stefan Dünkel, Dresden (DE); Violetta Sessi, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 591 days.

(21) Appl. No.: 18/149,733

(22) Filed: Jan. 4, 2023

(65) Prior Publication Data

US 2024/0224515 A1     Jul. 4, 2024

(51) Int. Cl.
*H10B 41/30*          (2023.01)
(52) U.S. Cl.
CPC .................................. *H10B 41/30* (2023.02)
(58) Field of Classification Search
CPC ...................................................... H10B 41/30
See application file for complete search history.

(56) References Cited

U.S. PATENT DOCUMENTS

| | | | |
|---|---|---|---|
| 5,023,680 A * | 6/1991 | Gill | ..................... H10D 30/686 |
| | | | 257/317 |
| 6,528,843 B1 | 3/2003 | Wu | |
| 6,773,974 B2 | 8/2004 | Wang et al. | |
| 7,701,767 B2 | 4/2010 | Chu et al. | |
| 9,842,844 B2 | 12/2017 | Wu et al. | |
| 2009/0085091 A1 | 4/2009 | Nagai | |
| 2022/0392912 A1* | 12/2022 | Tsai | ..................... H10D 30/69 |

OTHER PUBLICATIONS

1 European Search Report for corresponding EP Application No. 23190757.7-1212 dated Feb. 15, 2024, 10 pages.
Communication pursuant to Article 94(3) EPC from European Patent Application No. 23190757.7 dated Feb. 10, 2026, 7 pages.

* cited by examiner

*Primary Examiner* — Richard A Booth
(74) *Attorney, Agent, or Firm* — Yee Tze Lim; Hoffman Warnick LLC

(57) ABSTRACT
The disclosure provides a structure with a buried doped region for coupling a source line contact to the gate structure of a memory cell. A structure according to the disclosure includes a memory cell having a gate structure extending in a first lateral direction over a substrate. A buried doped region is within the substrate and extends in a second lateral direction from below the gate structure to a portion of the substrate laterally distal to the gate structure. A source line contact is on the portion of the substrate laterally distal to the gate structure. The buried doped region couples the source line contact to the gate structure of the memory cell through a lower surface of the gate structure.

17 Claims, 11 Drawing Sheets

STRUCTURE WITH BURIED DOPED REGION FOR COUPLING SOURCE LINE CONTACT TO GATE STRUCTURE OF MEMORY CELL

BACKGROUND

The present disclosure relates generally to integrated circuits, and more specifically, to structure with a buried doped region for coupling a source line contact to the gate structure of a memory cell.

Memory cells are important to the operation of integrated circuits (ICs). Memory cells may include a collection of electrically operated components, e.g., transistors, that can be read and/or written in any order and can electrically store working data or machine code for a device. Non-volatile memory, in particular, is capable of holding data even when there is no power to the device.

Flash memory may include memory cells formed of transistors having a stack of multiple gate conductors, each separated by regions of dielectric material. To record a one or zero within a flash memory cell, charge may be stored within a "floating gate" of the transistor located between the channel region of the transistor and an overlying control gate. The charge is stored by passing electric current between source and drain while applying a voltage of sufficient magnitude to trap charge carriers within the floating gate. As memory structures are built into circuit layouts of ever-decreasing size, conventional techniques to form a source line (SL) contact to the memory cells have proven incompatible with some processing techniques.

SUMMARY

An aspect of the disclosure is directed to structure including: a memory cell having a gate structure extending in a first lateral direction over a substrate; a buried doped region within the substrate, and extending in a second lateral direction from below the gate structure to a portion of the substrate laterally distal to the gate structure, wherein the second lateral direction is substantially perpendicular to the first lateral direction; and a source line contact to the portion of the substrate laterally distal to the gate structure, wherein the buried doped region couples the source line contact to the gate structure of the memory cell through a lower surface of the gate structure.

Another aspect of the disclosure provides a structure including: a first memory cell over a substrate and including a first gate structure extending in a first lateral direction; a second memory cell over the substrate, laterally adjacent the first memory cell in a second lateral direction substantially perpendicular to the first lateral direction, and including a second gate structure extending in the first lateral direction; a buried doped region within the substrate, and extending in the second lateral direction from below first gate structure to a portion of the substrate between the first memory cell and the second memory cell; and a source line contact to the portion of the substrate between the first memory cell and the second memory cell, wherein the buried doped region couples the source line contact to the first gate structure through a lower surface of the first gate structure.

An aspect of the disclosure provides a method including: forming a memory cell over a substrate, the memory cell including a gate structure extending in a first lateral direction over the substrate; forming a buried doped region within the substrate, the buried doped region extending in a second lateral direction from below the gate structure to a portion of the substrate laterally distal to the gate structure, wherein the second lateral direction is substantially perpendicular to the first lateral direction; and forming a source line contact to the portion of the substrate laterally distal to the gate structure, wherein the buried doped region couples the source line contact to the gate structure of the memory cell.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
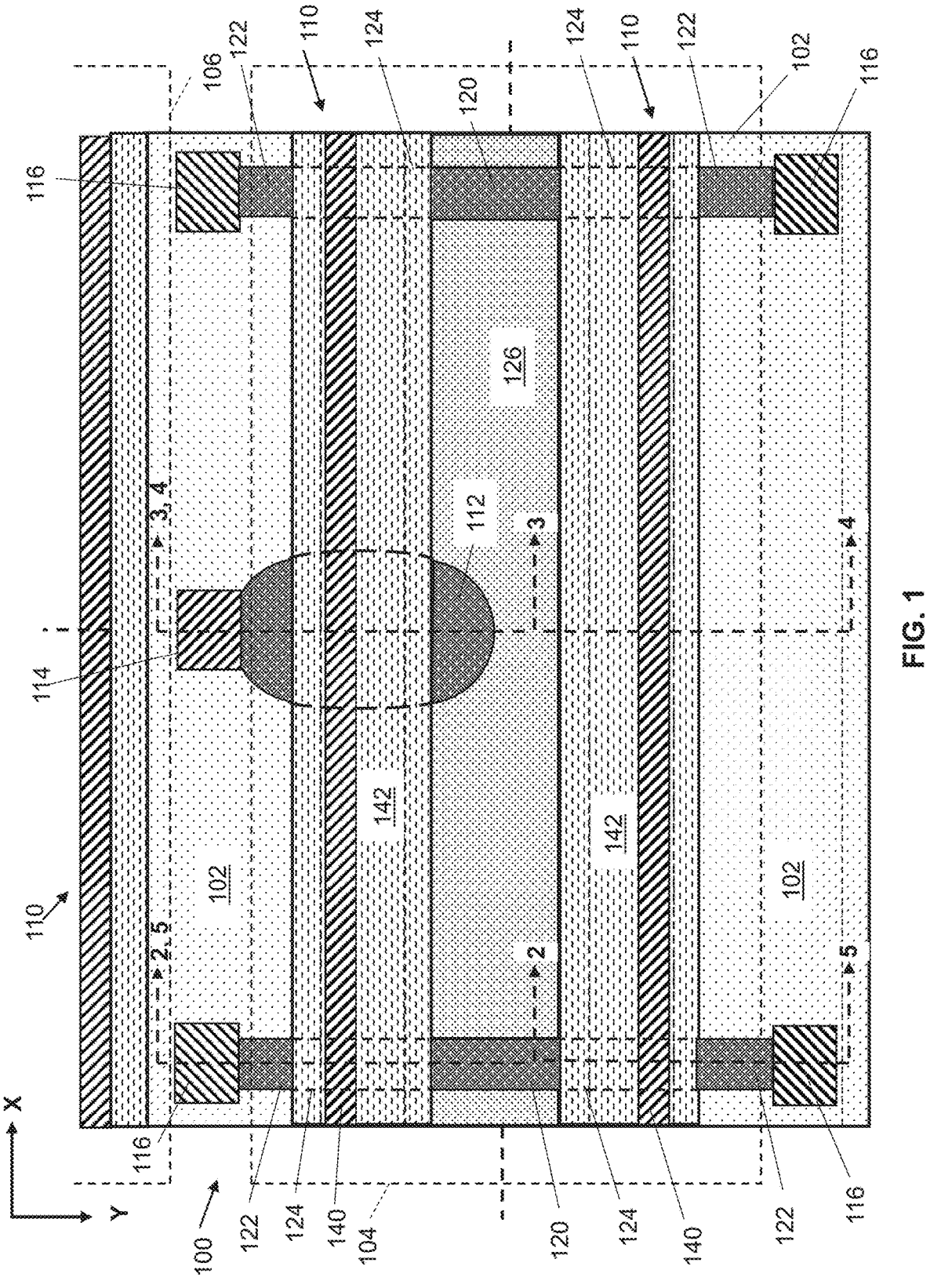
FIG. 1 shows a plan view of a structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

The disclosure provides a structure with a buried doped region for coupling a source line contact to the gate structure of a memory cell. A structure according to the disclosure includes a memory cell having a gate structure extending in a first lateral direction over a substrate. A buried doped region is within the substrate and extends in a second lateral direction from below the gate structure to a portion of the substrate laterally distal to the gate structure. A source line contact is on the portion of the substrate laterally distal to the gate structure. The buried doped region couples the source line contact to the gate structure of the memory cell through a lower surface of the gate structure.

Referring initially to FIG. 1, a plan view of an integrated circuit (IC) structure (simply "structure" hereafter) 100 is shown according to embodiments of the disclosure. Structure 100 may be formed on a substrate 102, e.g., one or more semiconductor materials. Substrate 102 may include but is not limited to silicon, germanium, silicon germanium, silicon carbide, or any other common IC semiconductor substrates. A portion or entire semiconductor substrate 102 may be strained. Substrate 102 is illustrated as a bulk semiconductor layer, but this is not required in all implementations. Various portions of a first memory cell 104, a second memory cell 106 that is adjacent first memory cell 104, and/or other devices may be formed on and within upper portions of substrate 102. Structure 100 may include first memory cell 104 (indicated with dashed lines) and second memory cell 106 (also indicated with dashed lines), in which various components are within first memory cell 104 or between cells 104, 106. Various components of first memory cell 104 are discussed in detail herein. By contrast, second memory cell 106 may be implemented using any currently known or later developed architecture to form a memory cell on substrate 102. First memory cell 104 may take the form of a flash memory cell, e.g., a transistor based non-volatile memory including multiple gate structures as discussed herein.

First memory cell 104 may include a set of gate structures 110, each located over respective portions of substrate 102. Second memory cell 106 similarly may include gate structure 110 extending in the same direction as gate structure 110 of first memory cell 104. Various portions of substrate 102 may be doped with p-type and/or n-type dopants to provide a desired conductivity type as discussed elsewhere herein. Each gate structure 110 may be in the form of, e.g., a set of "split gate architecture" in which one source region is shared for all of first memory cell 104 and electrically coupled to two gate structures 110, each having a respective drain region despite sharing one source region. The shared source region may be embodied as a buried doped region 112 within substrate 102 and extending in a different direction from the orientation of gate structure(s) 110 thereover. Buried doped region 112 is shown with dashed lines to indicate where it is below gate structure 110. According to an example, gate structure(s) 110 may extend horizontally over substrate 102 in a first lateral direction (e.g., in parallel with the X axis as shown in FIG. 1) whereas buried doped region 112 extends in a second lateral direction (e.g., in parallel with the Y axis as shown in FIG. 1) substantially perpendicular to the orientation of gate structure(s) 110. Buried doped region 112 may be substantially ovular, e.g., to provide high electrical conductivity to gate structure 110 in areas that are below gate structure 110, while retaining a smaller surface area in locations coupled to overlying contacts.

A source line contact 114 may be coupled to buried doped region 112 in a portion of substrate 102 that is laterally distal to gate structure 110. Source line contact may include any currently known or later developed conductive materials, e.g., copper (Cu), aluminum (Al), etc., and/or other materials suitable for use in conductive contacts or vias of a circuit structure. Source line contact 114, as shown, may be laterally distal to gate structure 110 by a predetermined distance in the second lateral direction. Source line contact 114 thus may substantially laterally align (e.g., along the first lateral direction and/or the X-axis as shown) with a set of bit line contacts 116 that are also over substrate 102 and coupled to gate structure 110 as discussed herein. More specifically, source line contact 114 may be laterally between one pair of bit line contacts 116, such that contacts 114, 116 are laterally aligned in the same direction (e.g., each may be aligned in the direction of the X-axis as shown). Contact(s) 114, 116 may include refractory metal liners (not shown) along the sidewalls thereof, e.g., to reduce electromigration degradation as known in the art. The position of buried doped region 112 beneath gate structure 110 allows source line contact 114 to be formed outside gate structure 110, and more generally, outside first memory cell 104.

Portions of substrate 102 in first memory cell 104 may be doped to form electrically active source/drain ("S/D") regions, e.g., a set of source regions 120 and a set of drain regions 122 (collectively "S/D regions" 120, 122 hereafter). S/D regions 120, 122 are doped, electrically active regions in substrate 102 that define opposite terminals for current flow below gate structure(s) 110 of first memory cell 104. When a voltage is applied to gate structure 110, a conductive channel within a channel region 124 (below gate structure 110 and hence indicated with dashed lines) enables current flow between source region 120 and drain region 122. As will be recognized, source/drain regions 120, 122 are doped with a dopant having a selected polarity for a respective transistor. An n-type transistor may include n-type dopants such as but not limited to: phosphorous (P), arsenic (As), antimony (Sb), and a p-type transistor may include p-type dopants such as but not limited to: boron (B), indium (In) and gallium (Ga).

Each source region 120 of structure 100 may be electrically coupled to source line contact 114 through buried doped region 112 and a doped well 126. Doped well 126 may extend in the first horizontal direction (e.g., in parallel with gate structure(s) 110) to connect buried doped region 112 to source regions 120. Thus, source line contact 114 can affect current flow through multiple source regions 120 simultaneously. Similar dopants, typically with different concentrations, may be used for buried doped region 112 and doped well 126. Any suitable thermal process may be carried out to drive in the dopants. It is understood that processing for S/D regions 120, 122 may be carried out before forming certain portions of gate structure(s) 110. S/D regions 120, 122, as well as buried doped region 112 and doped well 126, may be formed using any now known or later developed technique, e.g., in-situ doping, ion implantation, etc. Dopants used may be any dopant appropriate for the transistor to be formed. Any type of anneal and/or other process to drive in dopants may be performed. Additionally, silicide material (s) (not shown) may be formed on portions of buried doped region 112 and/or drain region 122 that are below source line contact(s) 114 and bit line contact(s) 116, respectively, by depositing a metal on semiconductor material thereof, annealing the metal to form silicide material(s), and removing any non-annealed metal.

Figure 2:
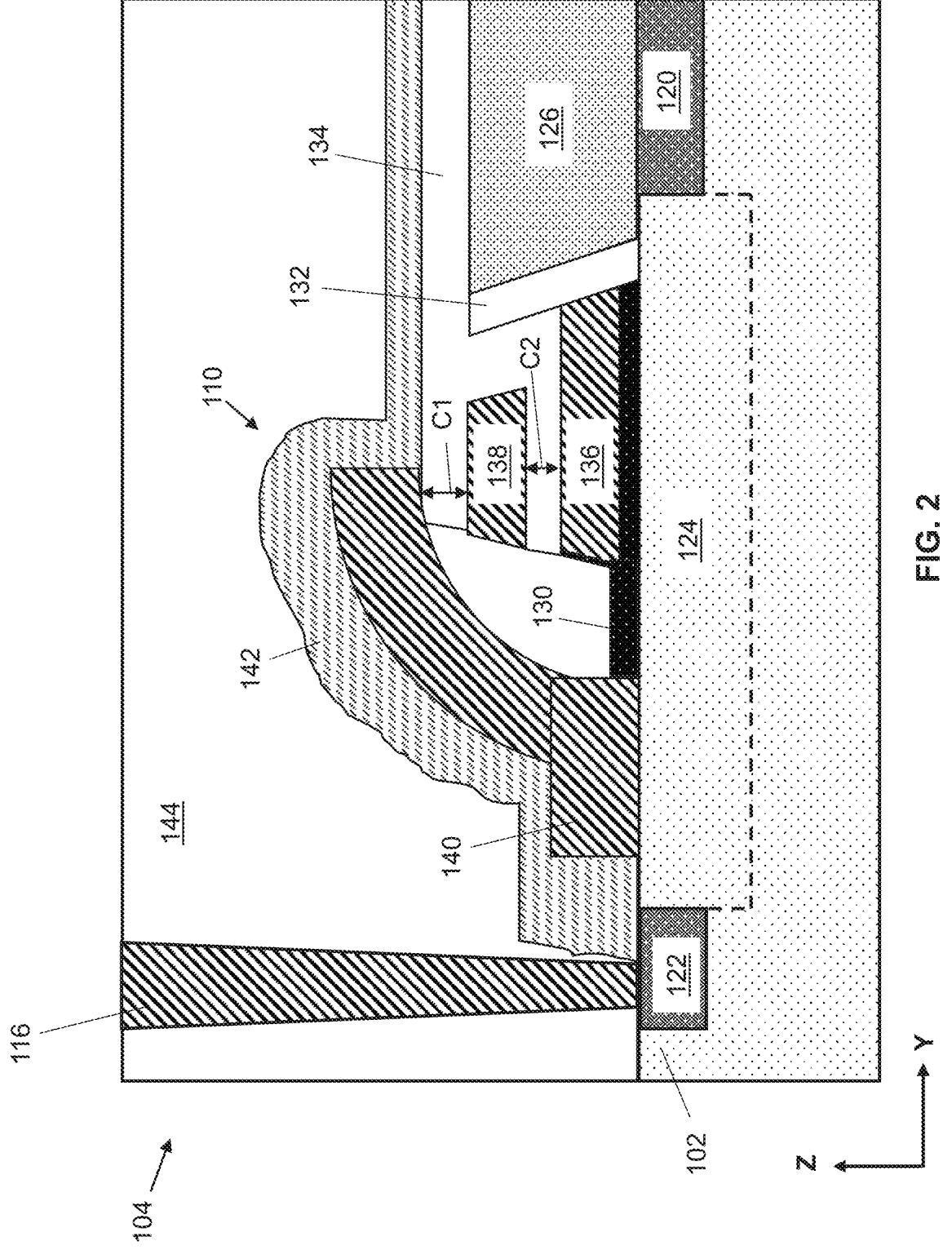
FIG. 2 shows a first cross-sectional view of the structure along line 2-2 of FIG. 1 according to embodiments of the disclosure.

Referring to FIGS. 1 and 2 together, in which FIG. 2 illustrates first memory cell 104 along view line 2-2 of FIG. 1, various aspects of first memory cell 104 and gate structure 100 are shown and discussed in more detail. The cross-section of first memory cell 104 shown in FIG. 2 illustrates S/D regions 120, 122 and channel region 124 therebetween. Gate structure 110 may include multiple layers of varying composition over substrate 102 to provide various active and insulating elements for storage and retrieval of data in memory. Gate structure 110 thus may include a gate dielectric layer 130 over channel region 124, doped well 126 over source region 120, and an insulative spacer 132 laterally separating gate dielectric layer 130 from doped well 126. Gate dielectric layer 130 may be formed, e.g., by depositing any now known or later developed high-K material typically used for gate dielectric layers such as but not limited to metal oxides on channel region 124.

First memory cell 104 may be provided in the form of a transistor device (e.g., a field effect transistor or "FET") including an isolation layer 134 surrounding a floating gate 136 and a control gate 138. A word line 140 formed of one or more conductive materials may be on isolation layer 134 over floating gate 136 and control gate 138. Word line 140 may extend horizontally (e.g., in the X-direction of FIG. 1) to interconnect control gates 138 of several memory cells in one row of an array. Word line 140 may be shaped to be partially on substrate 102 as well as being partially on and adjacent isolation layer 134. As shown by example in FIG. 2 a portion of word line 140 is on an upper surface of channel region 124 before transitioning into an arcuate portion extending over a sidewall and upper surface of isolation layer 134. A lateral end of word line 140 that is on isolation layer 134 may vertically overlie gates 136, 138. Control gate 138 may be vertically between floating gate 136 and word line 140, such that isolation layer 134 creates two capacitive junctions C1, C2 between control gate 138 and word line 140 (i.e., capacitive junction C1) and floating gate 136 (i.e., capacitive junction C2). Gates 136, 138, as well as word line 140 and/or other electrically conductive materials described herein, may include, for example, aluminum, copper, tungsten, and/or similar materials. To store data (e.g., a one or zero bit) in memory cell 104, word line 140 may apply a threshold voltage to control gate 138 via capacitive junction C1, and source line contact 114 simultaneously may apply an electric current through buried doped region 112 (FIG. 1) and doped well 126 to induce a current flow through channel region 124. The electric current within channel region 124 and induced electric field in control gate 138 across capacitive junction C2, may cause charge carriers in channel region 124 to be of sufficient energy to cross gate dielectric layer 130 to enter floating gate 136. Charge carriers being stored in floating gate 136 may be electrically detectable to indicate a stored logic level in memory cell 104.

An insulative film 142 may be on word line 140 and isolation layer 134, e.g., to strengthen the electrical insulation between various portions of gate structure 110 and other material(s) located on substrate 102. Insulative film 142, in particular, may insulate word line 140 from other conductors such as source line contacts 114 and bit line contacts 116 (FIG. 1 only) that are also formed over substrate 102. Insulative film 142 may include any one or more materials suitable for electrically isolating conductive materials from each other, and in various examples may include nitride-based insulators such as silicon nitride (SiN).

An inter-level dielectric (ILD) layer 144 may be above substrate 102 and gate structure 110 and may be adjacent contact(s) 114 (FIG. 1 only), 116. ILD layer 144 may be formed by any appropriate deposition or other techniques of forming an insulative material on a structure. ILD layer 144, in this position, also may surround the outer periphery of each element (e.g., gate structure 110, contacts 114, 116, and/or subcomponents thereof) formed on or over substrate 102. ILD layer 144 may include the same insulating material as isolation layer 134 or may include a different electrically insulative material for vertically separating structure 100 from overlying materials, e.g., various horizontally extending wires or vias. When ILD layer 144 is formed, it can be planarized (e.g., using chemical mechanical polishing (CMP)), but its upper surface may remain above gate structure 110. ILD layer 144 may entirely cover first memory cell 104 except in locations where conductive contacts are formed.

Figure 3:
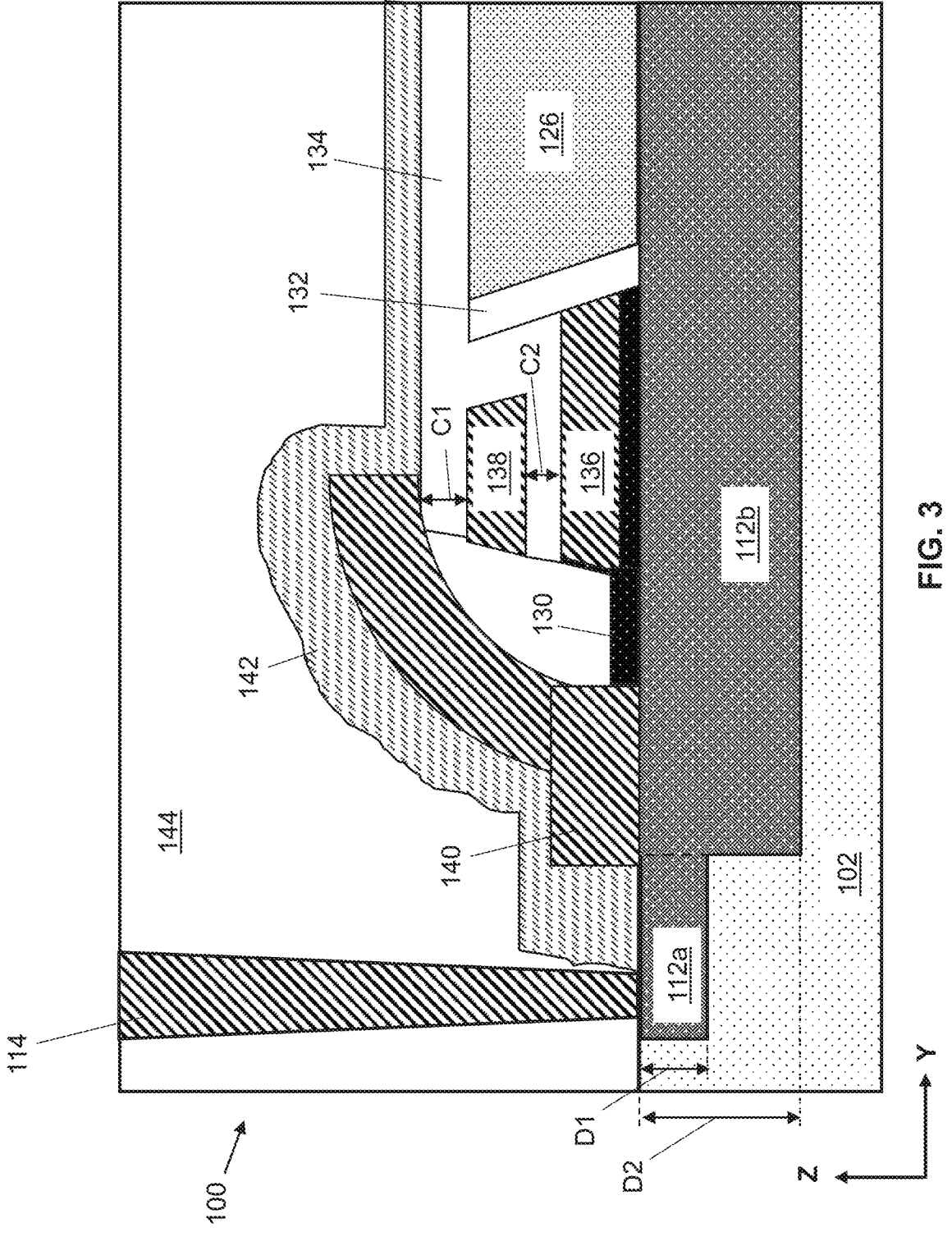
FIG. 3 shows a second cross-sectional view of the structure along line 3-3 of FIG. 1 according to embodiments of the disclosure.

Referring now to FIGS. 1 and 3, in which FIG. 3 depicts a cross-section of gate structure 110 along view lines 3-3 of FIG. 1, various aspects of buried doped region 112 are discussed in further detail. Buried doped region 112 may extend continuously from source line contact 114 to doped well 126 below gate structure 110. Due to the laterally continuous structure of buried doped region 112, the biasing of gates 136, 138 via word line 140 will not affect current flow from source line contact 114 to doped well 126, i.e., channel region 124 (FIG. 1 only) is not within any portion of buried doped region 112. Buried doped region 112 thus functions solely as a conductive electrical connection from source line contact 114 to doped well 126 through portions of substrate 102 that are below gate structure 110. To provide a stronger connection from source line contact 114 to doped well 126, buried doped region 112 may have a non-uniform depth. Buried doped region 112 may include, e.g., a first segment 112a below source line contact 114 extending to a first depth D1 below the upper surface of substrate 102. First depth D1 may be, e.g., less than half of the total thickness of substrate 102. Buried doped region 112 also may include a second segment 112b below gate structure 110. Second segment 112b may have a second depth D2 that is larger than first depth D1, e.g., it may be more than half of the total thickness of substrate 102. Second depth D2 may be larger than first depth D2, in part, due to second segment 112b being formed with gate structure 110 already in place as discussed herein relative to methods of forming structure 100. Second depth D2, in addition, may be deeper than first depth D1 to reduce electrical resistance in areas of buried doped region 112 that are below gate structure 110.

Figure 4:
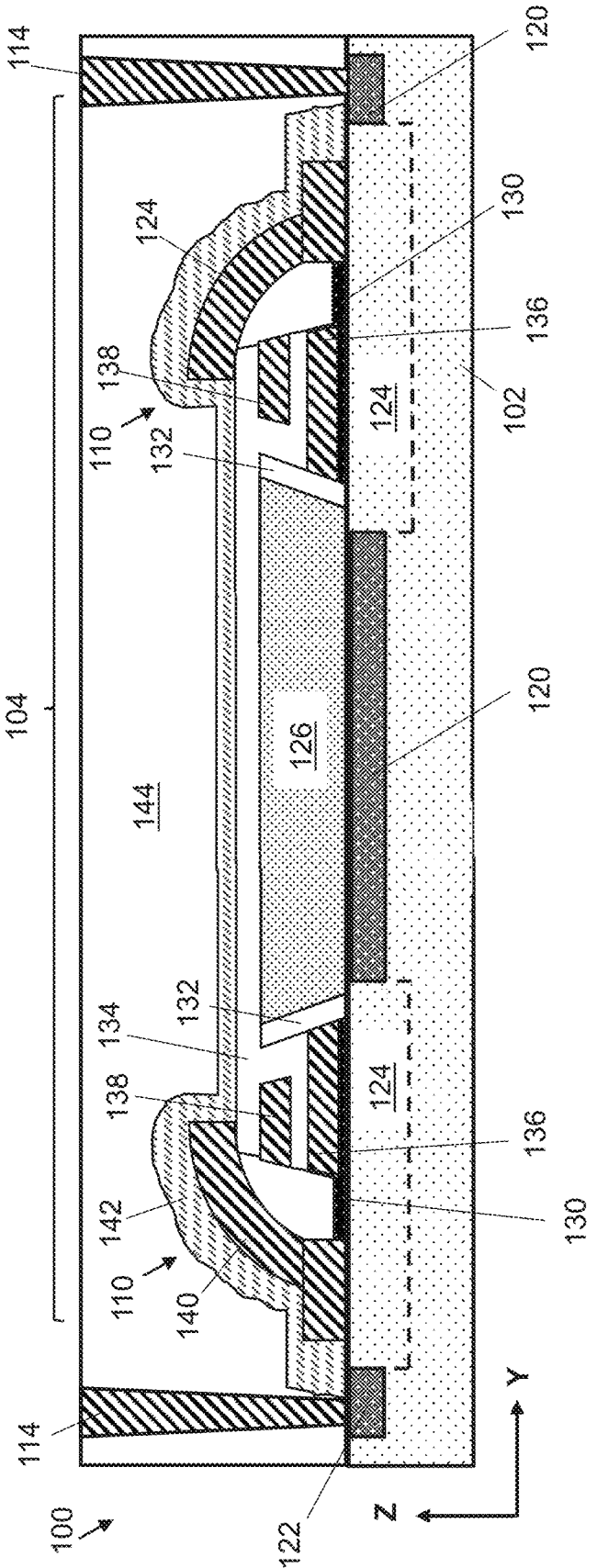
FIG. 4 shows a third cross-sectional view of the structure along line 4-4 of FIG. 1 according to embodiments of the disclosure.
Figure 5:
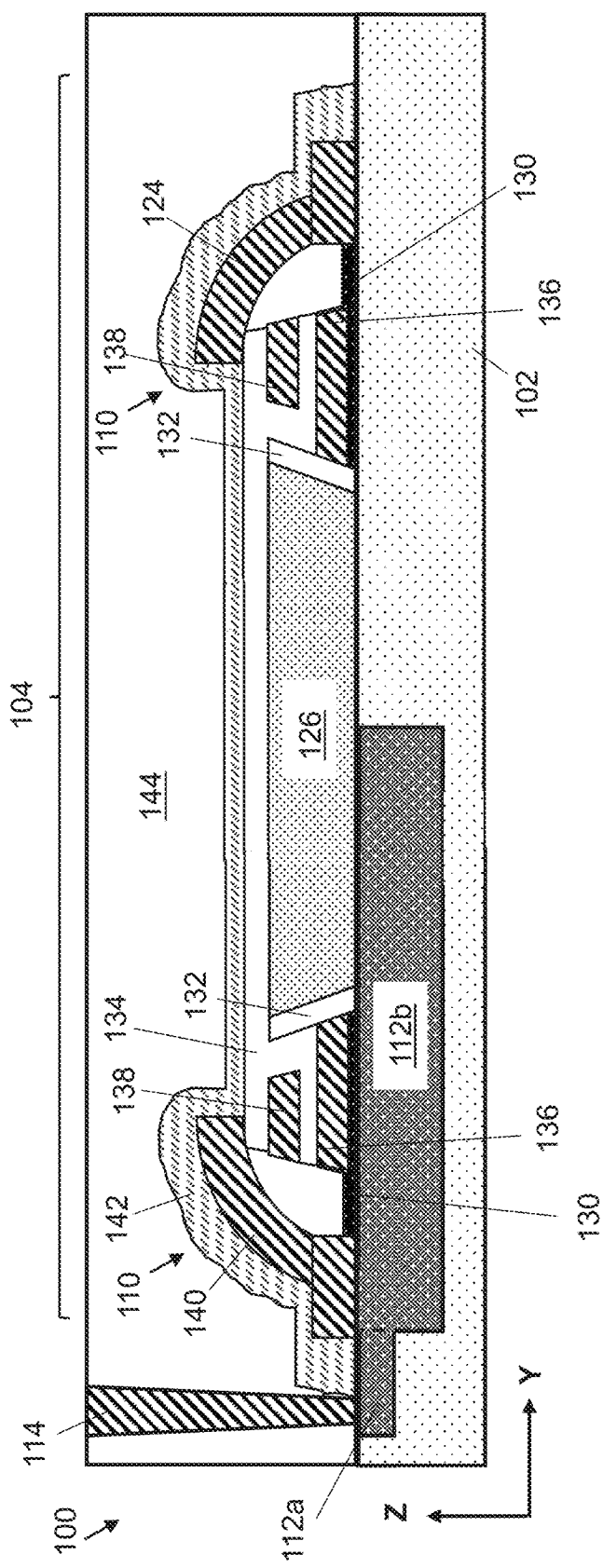
FIG. 5 shows a fourth cross-sectional view of the structure along line 5-5 of FIG. 1 according to embodiments of the disclosure.

FIGS. 4 and 5 depict expanded cross-sectional views, along view line 4-4 and 5-5 of FIG. 1 respectively, of multiple gate structures 110 within first memory cell 104 is shown. Gate structures 110 of first memory cell 104 may be embodied as a "split gate" architecture. In this case, first memory cell 104 may include two gate structures 110 each coupled to one doped well 126 positioned therebetween. In this case, first memory cell 104 may be configured to store four bits of data, e.g., by each gate structure 110 having floating gates 136 located over a respective channel region 124, and both gate structures 110 being coupled to source line contact 114 through buried doped region 112. This configuration is known as a "split gate architecture" because each gate structure 110 may be formed over substrate 102 on opposite sides of doped well 126. Despite the term "split gate" being used, gate structures 110 in first memory cell 104 are structurally and operationally independent of each other (i.e., each has its own word line 140).

Each gate structure 110 may not include vertically extending conductive contacts thereon (i.e., there are no counterparts to source line contact 114 and bit line contact 116 on gate structure 110) and may be electrically controlled through word lines 140 therein. Moreover, embodiments of structure 100 allow source line contact 114 to be placed outside memory cell 104 instead of being formed directly to doped well 126. Despite gate structures 110 being structurally and operationally distinct, portions of one non-active material may be structurally incorporated into multiple gate structures, e.g., each gate structure 110 may include portions of isolation layer 134 and insulative film 142 therein.

Figure 6:
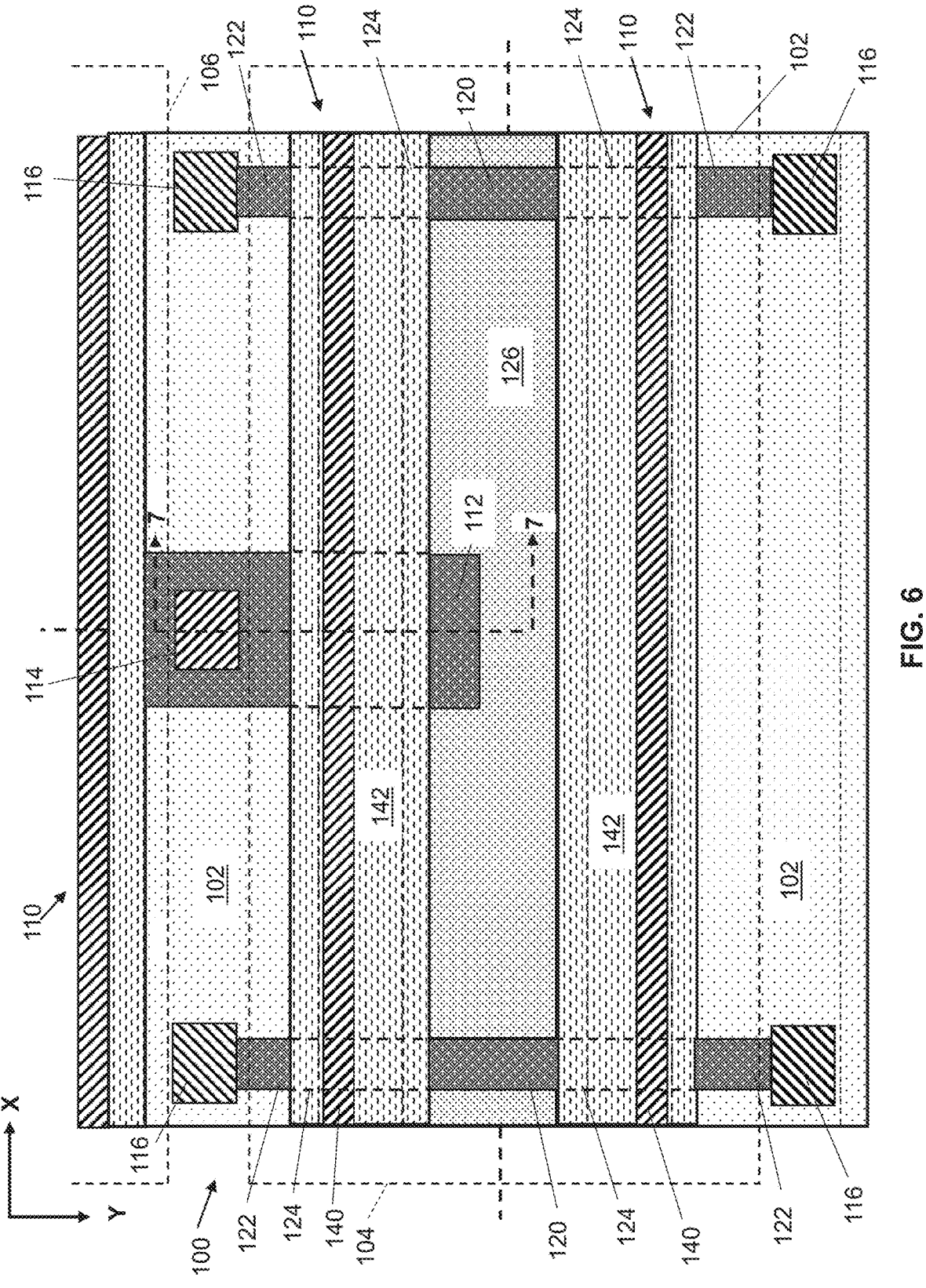
FIG. 6 shows a plan view of a structure according to further embodiments of the disclosure.
Figure 7:
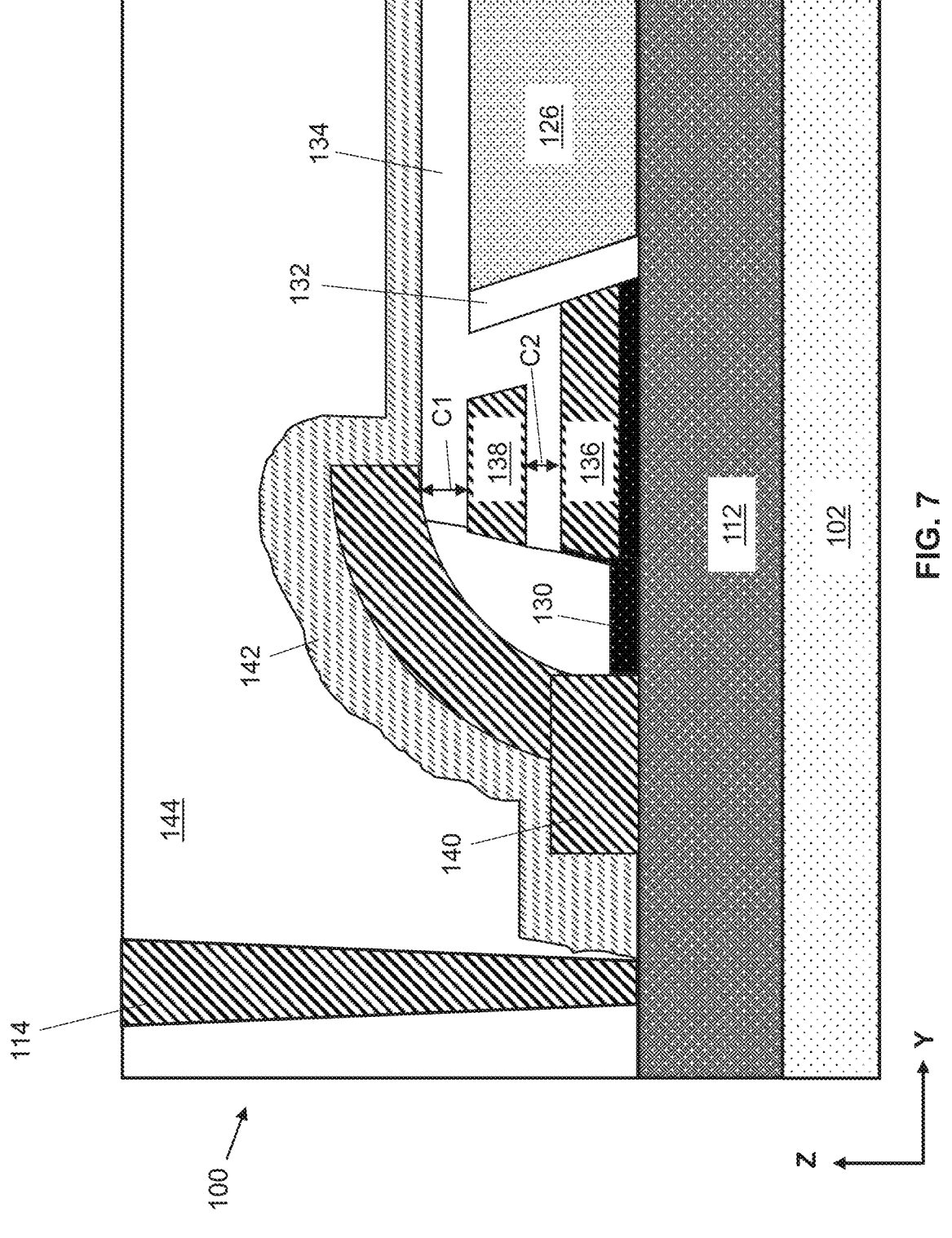
FIG. 7 shows a cross-sectional view of the structure along line 7-7 of FIG. 6

FIGS. 6 and 7 depict further implementations of structure 100, in which buried doped region 112 may include a different structure, e.g., a non-ovular shape in plane X-Y and/or a single depth within substrate 102. According to the plan view of FIG. 6, buried doped region may be substantially quadrilateral (e.g., rectangular as shown) such that it is of uniform thickness and length below doped well 126, gate structure 110, etc. Additionally, buried doped region 112 may horizontally surround source line contact 114 such that no portion of source line contact 114 is located directly over a portion of substrate 102. In this case, as shown in FIG. 7, buried doped region 112 may extend horizontally beyond source line contact 114 and may have a substantially uniform depth. FIG. 7 depicts, along view line 7-7 of FIG. 6, implementations in which buried doped region 112 has a uniform depth below gate structure 110 and source line contact 114. In this case, buried doped region 112 may not be subdivided into distinct segments, e.g., as illustrated in FIGS. 3 and 5 and discussed elsewhere herein. In all other respects, structure 100 may be structurally similar or identical to other implementations of structure 100 discussed herein. The size and shape of buried doped region 112 may be controlled to affect various physical and electrical properties, e.g., the resistance from source line contact 116 to channel region 124, isolation of laterally adjacent active semiconductor materials, etc.

Figure 8:
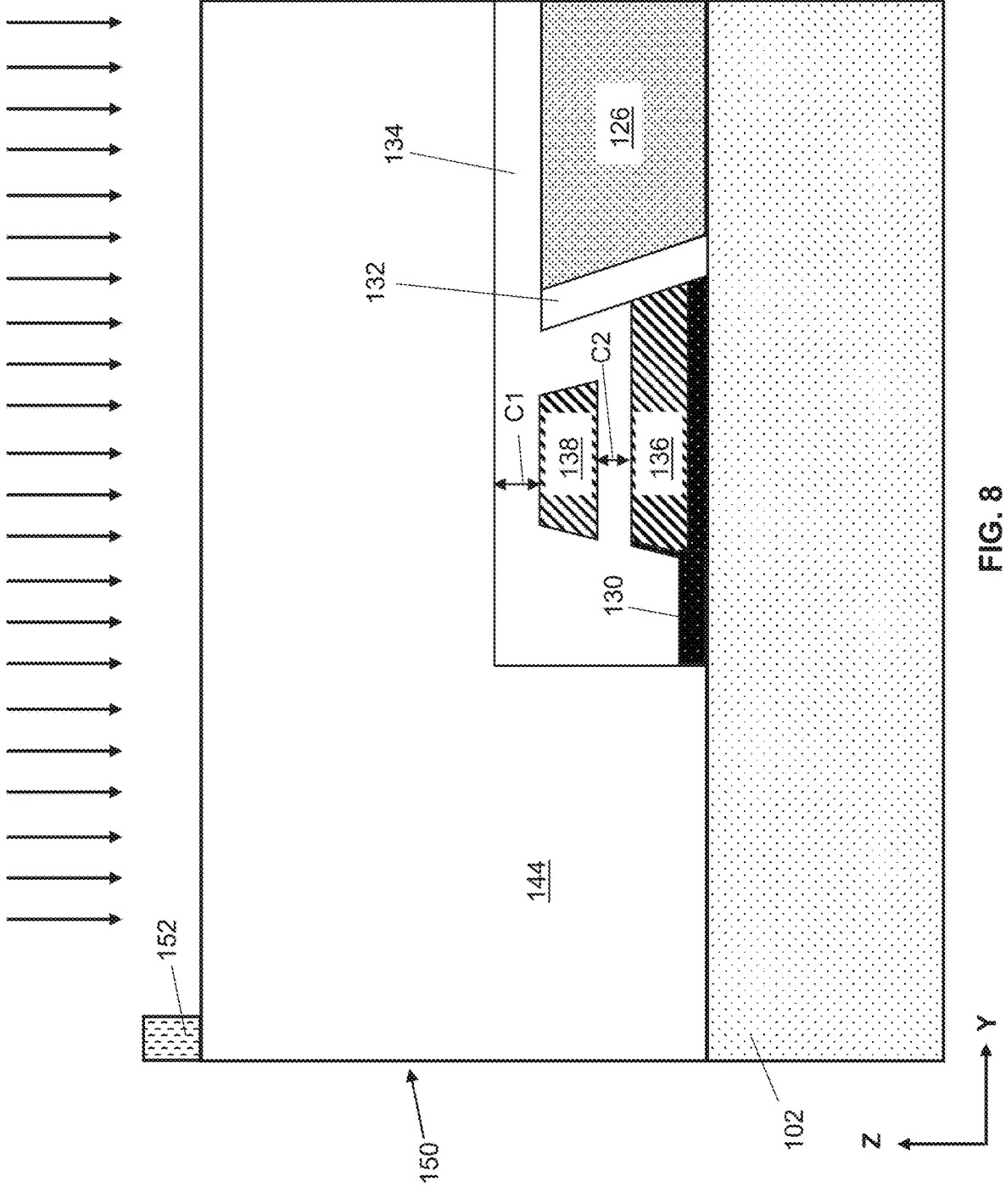
FIGS. 8-11 depict various stages of a method to form a structure according to embodiments of the disclosure.

Turning to FIG. 8, methods of the disclosure include forming structure 100 (FIG. 1) can be integrated into conventional process flows to form non-volatile memory (e.g., flash memory cells) for a device. FIG. 8 depicts a preliminary structure 150 before certain portions of gate structure 110 (FIGS. 1-7) have been formed on substrate 102, e.g., source line contact 114 (FIGS. 1, 3, 5-7) and/or word line 140 (FIGS. 1-7) have been formed over substrate 102. The processes described herein may be implemented, e.g., after doped well 126, isolation layer 134, gates 136, 138, ILD layer 144, etc., have been formed, or may occur solely on substrate 102. Methods of the disclosure may include forming a mask 152 over portions of substrate 102 which are not beneath or located near gate structure(s) 110. Mask 152 may include any currently known or later developed masking material effective to prevent any portion of substrate 102 and/or other semiconductor materials located thereunder from being doped. With mask 152, methods of the disclosure may include doping of substrate 102 (e.g., indicated with downward facing arrows in FIG. 6). The doping of substrate 102 may include ion implantation to a specified strength and/or duration, such that the implanted ions pass through gate structure 110 such that only portions of substrate 102 not covered by mask 152 are doped. In further implementations, substrate 102 may be doped via other currently known or later developed processes to dope and/or change the conductivity of substrate 102.

Figure 9:
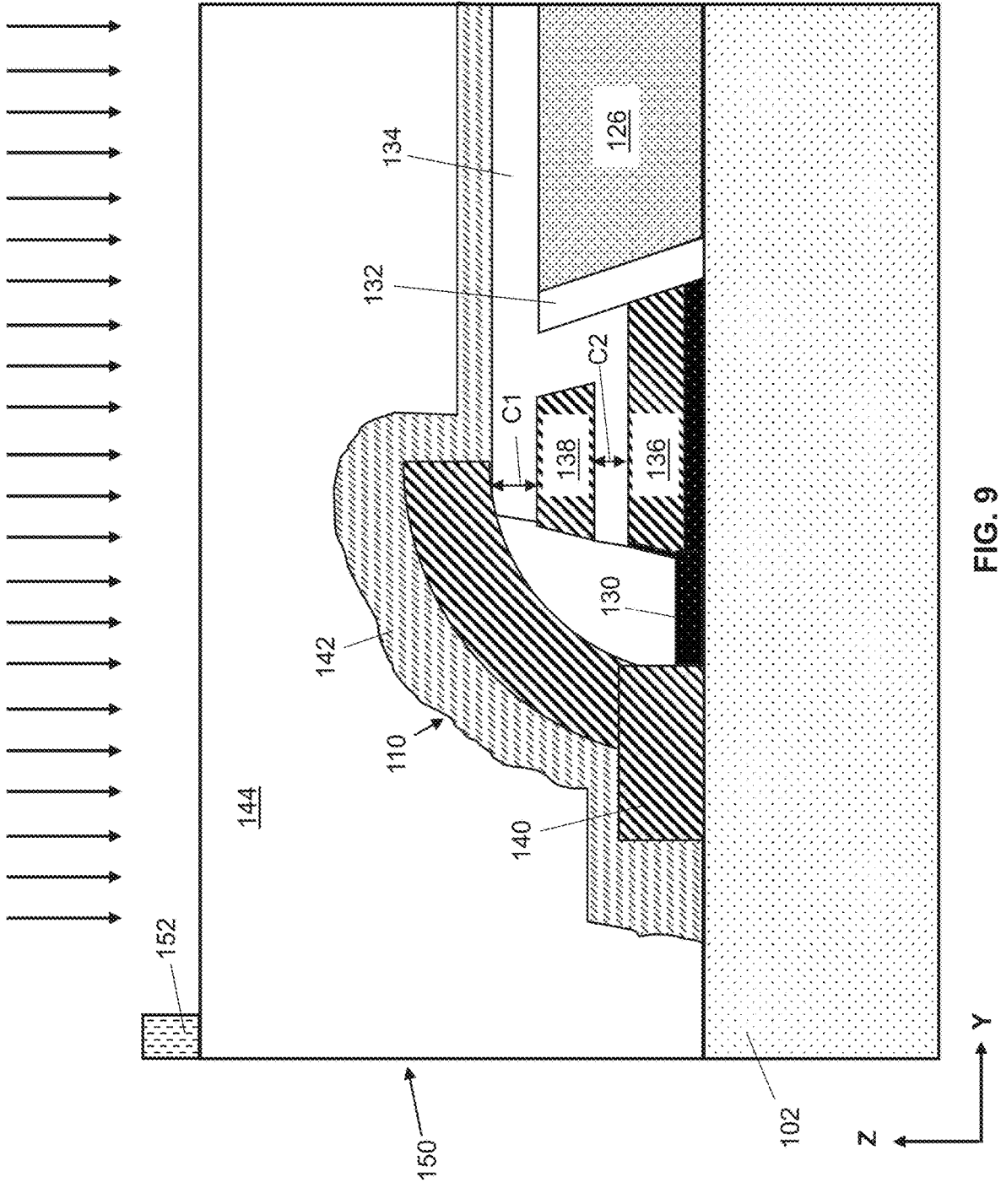

FIG. 9 depicts an alternative doping process, e.g., performed after source word line 140, and/or other components of gate structures 110 are already formed on substrate 102. Gate structures 110 of preliminary structure 150 may include, e.g., floating gate 136, control gate 138, and word line 140 for a flash memory cell as discussed herein. Preliminary structure 150, however, may not yet include source line contact 114 (FIGS. 1, 3, 5-7) or doped portions of substrate 102 for coupling doped well 126 to the eventual source line contact 114. With ILD layer 144 and components thereunder in place, the doping of substrate 102 may be implemented substantially similarly or identically to other doping techniques discussed herein (e.g., those described with respect to FIG. 8). Regardless of how the doping is implemented, buried doped region 112 may be formed.

Figure 10:
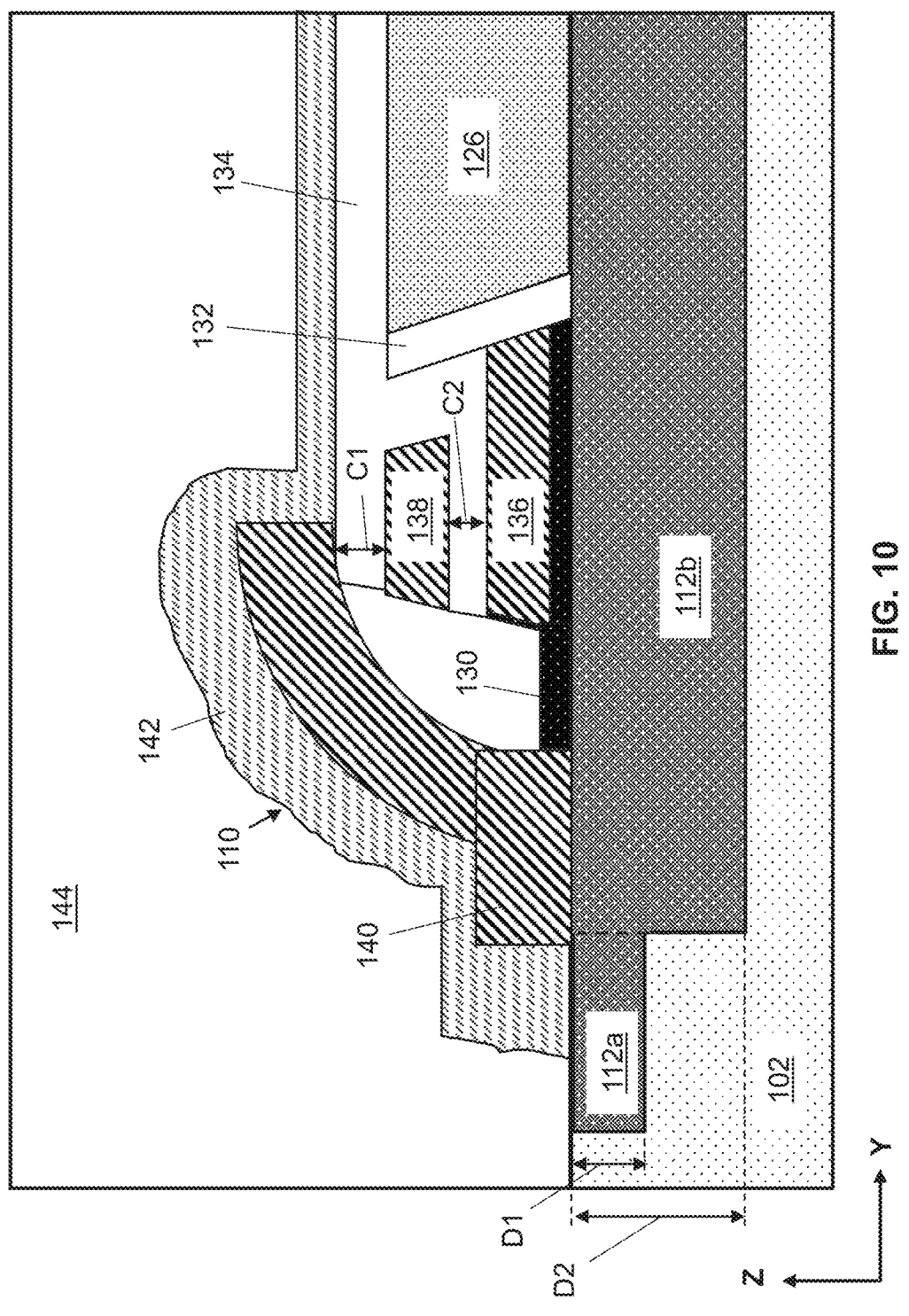

Referring now to FIG. 10, the doping of substrate 102 may produce buried doped region 112 with first segment 112a and second segment 112b therein. Mask 152 may be removed after the doping of substrate 102 concludes, e.g., by stripping of masking material from ILD layer 144. Segments 112a, 112b may have different depths D1, D2 upon being formed. The different depths of each segment 112a, 112b within substrate 102 may arise from, e.g., controlling the doping time and/or intensity in different areas and/or may arise automatically from the presence of gate structure(s) 110 on portions of substrate 102 subject to doping. In any case, buried doped region 112 will electrically couple doped well 126 to a location laterally distal to gate structure 110 (e.g., along the Y-axis as shown).

Figure 11:
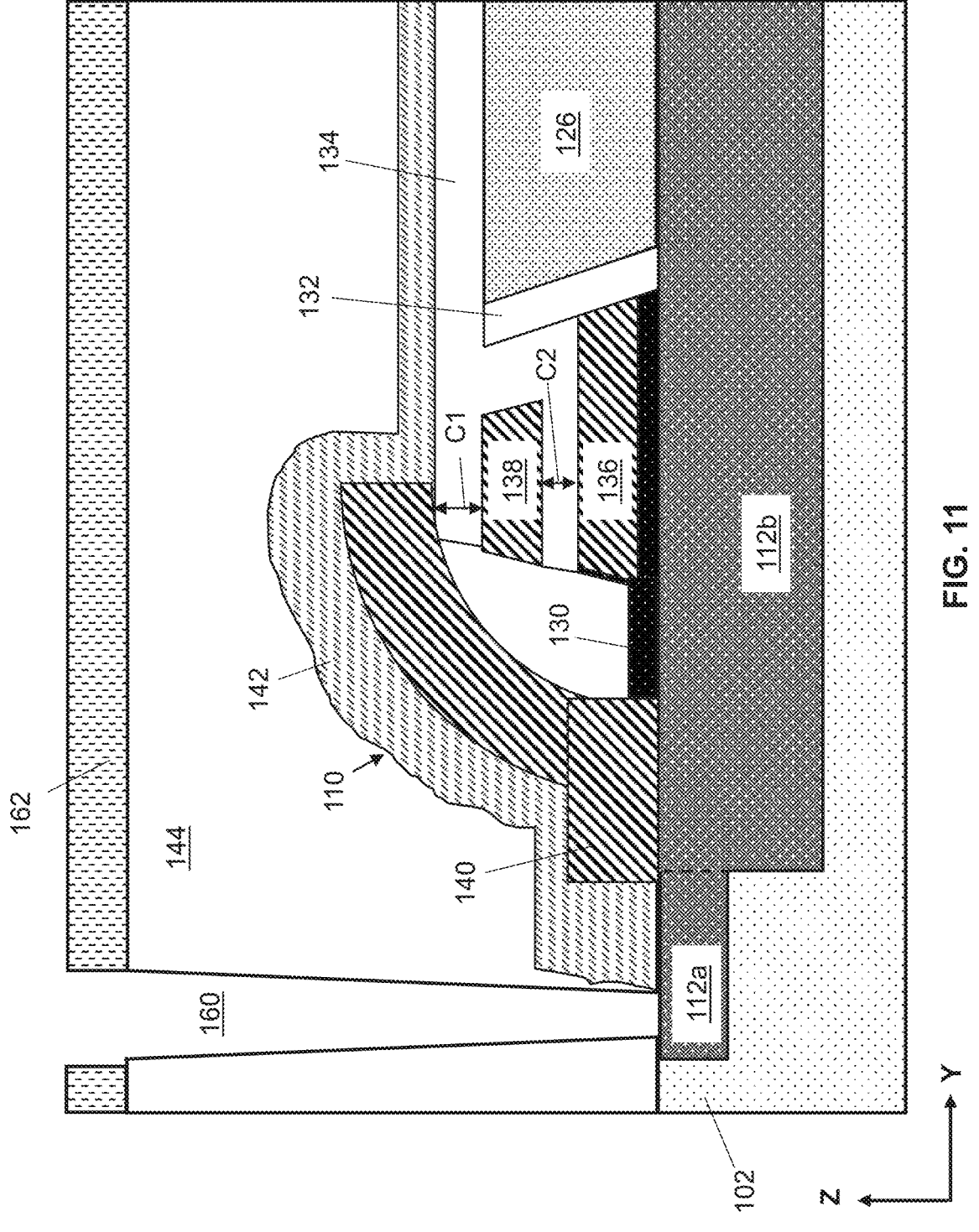

FIG. 11 depicts further processing of the structure after buried doped region 112 (and where applicable, segments 112a, 112b thereof) have been formed. A source line opening 160 may be formed within ILD layer 144 to expose an upper surface of buried doped region 112 (e.g., within first segment 112a thereof). Source line opening 160 may be formed with the aid of a mask 162, such that portions of ILD layer 144 not covered by mask 162 may be downwardly etched to a desired depth. In some implementations, the forming of source line opening 160 may be simultaneous with the forming of one or more openings (not shown) to provide bit line contacts 116 elsewhere to substrate 102. After source line opening 160 is formed, mask 162 may be removed and conductive material(s) may be formed within source line opening 160 to create source line contact(s) 114 (FIGS. 1, 3, 5-7) therein. The various operations discussed herein thus provide structure 100 (FIGS. 1-7) with source line contact 114 coupled to doped well 126 through buried doped region 112.

Embodiments of the disclosure provide various technical and commercial advantages, examples of which are discussed herein. Embodiments of structure 100 may include source line contact(s) 114 and bit line contact(s) 116 for first memory cell 104 (e.g., a flash memory cell) in a single row, instead of forming each contact 114, 116 in different positions, e.g., locations inside first memory cell 104 and outside first memory cell 104. As compared with conventional memory cell configurations, first memory cell 104 may be formed with fewer instances of masking, doping, and etching by enabling contacts 114, 116 to be formed in similar locations. Buried doped region 112 itself may be formed after gate structure(s) 110 for first memory cell 104 are formed, thus further simplifying the structure and manufacture of memory cell(s) within structure 100. The size and location of buried doped region 112, additionally, may be of negligible resistance when implemented in a device due to the ability to form segments 112*a*, 112*b* of significant depth within substrate 102.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing structures as part of either (a) an intermediate product, such as a motherboard, or (b) an end product. The end product can be any product that includes integrated circuit chips, ranging from toys and other low-end applications to advanced computer products having a display, a keyboard or other input structure, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
   a memory cell having a gate structure extending in a first lateral direction over a substrate;
   a buried doped region within the substrate, and extending in a second lateral direction from below the gate structure to a portion of the substrate laterally distal to the gate structure, wherein the buried doped region is substantially ovular and wherein the second lateral direction is substantially perpendicular to the first lateral direction; and
   a source line contact to the portion of the substrate laterally distal to the gate structure, wherein the buried doped region couples the source line contact to the gate structure of the memory cell through a lower surface of the gate structure.

2. The structure of claim 1, wherein the gate structure is free of conductive contacts thereon and is surrounded by an isolation layer.

3. The structure of claim 1, wherein the source line contact is laterally between the memory cell and an adjacent memory cell.

4. The structure of claim 1, wherein the buried doped region includes:
   a first segment below the source line contact having a first depth below an upper surface of the substrate; and
   a second segment adjacent the first segment, below the gate structure of the memory cell, and having a second depth below the upper surface of the substrate, wherein the second depth is larger than the first depth.

5. The structure of claim 1, wherein the memory cell includes a flash memory cell.

6. The structure of claim 1, wherein the source line contact is laterally between a pair of bit line contacts in the first lateral direction.

7. A structure comprising:
   a first memory cell over a substrate and including a first gate structure extending in a first lateral direction;
   a second memory cell over the substrate, laterally adjacent the first memory cell in a second lateral direction substantially perpendicular to the first lateral direction, and including a second gate structure extending in the first lateral direction;
   a buried doped region within the substrate, and extending in the second lateral direction from below first gate structure to a portion of the substrate between the first memory cell and the second memory cell, wherein the buried doped region is substantially ovular; and a source line contact to the portion of the substrate between the first memory cell and the second memory cell, wherein the buried doped region couples the source line contact to the first gate structure through a lower surface of the first gate structure.

8. The structure of claim 7, wherein the first gate structure is free of conductive contacts thereon and is surrounded by an isolation layer.

9. The structure of claim 7, wherein the first gate structure includes a split gate architecture, and the buried doped region is located between a first portion of the split gate architecture and a second portion of the split gate architecture in the first lateral direction.

10. The structure of claim 7, wherein the buried doped region includes:

a first segment below the source line contact having a first depth below an upper surface of the substrate; and a second segment adjacent the first segment, below the first gate structure, and having a second depth below the upper surface of the substrate, wherein the second depth is larger than the first depth.

11. The structure of claim 7, wherein the first memory cell includes a flash memory cell.

12. The structure of claim 7, wherein the source line contact is laterally between a pair of bit line contacts in the first lateral direction.

13. A method comprising:

forming a memory cell over a substrate, the memory cell including a gate structure extending in a first lateral direction over the substrate;

forming a buried doped region within the substrate, the buried doped region extending in a second lateral direction from below the gate structure to a portion of the substrate laterally distal to the gate structure, wherein the buried doped region is substantially ovular and wherein the second lateral direction is substantially perpendicular to the first lateral direction; and forming a source line contact to the portion of the substrate laterally distal to the gate structure, wherein the buried doped region couples the source line contact to the gate structure of the memory cell.

14. The method of claim 13, wherein forming the buried doped region includes:

forming a first segment below the source line contact having a first depth below an upper surface of the substrate; and forming a second segment adjacent the first segment, below the gate structure of the memory cell, and having a second depth below the upper surface of the substrate, wherein the second depth is larger than the first depth.

15. The method of claim 13, wherein the gate structure includes a split gate architecture, and forming the buried doped region includes forming the buried doped region between a first portion of the split gate architecture and a second portion of the split gate architecture in the first lateral direction.

16. The method of claim 13, wherein forming the memory cell includes forming a flash memory cell.

17. The method of claim 13, wherein the source line contact is formed laterally between a pair of bit line contacts in the first lateral direction.

* * * * *